United States Patent [19]
Benedict et al.

[11] Patent Number: 5,339,843
[45] Date of Patent: Aug. 23, 1994

[54] CONTROLLED AGITATION CLEANING SYSTEM

[75] Inventors: David R. Benedict, Susquehanna, Pa.; James F. Burke, Endwell, N.Y.

[73] Assignee: Martin Marietta Corporation, Philadelphia, Pa.

[21] Appl. No.: 47,080

[22] Filed: Apr. 16, 1993

[51] Int. Cl.$^5$ .............................................. B08B 3/04
[52] U.S. Cl. ................... 134/56 R; 134/95.2; 134/186; 134/200
[58] Field of Search ............ 134/56 R, 57 R, 57 DL, 134/58 DL, 95.2, 148, 153, 186, 191, 200

[56] References Cited

U.S. PATENT DOCUMENTS

| | | | |
|---|---|---|---|
| 2,918,925 | 12/1959 | Dopler | 134/148 X |
| 3,673,042 | 6/1972 | Mayers | 134/200 X |
| 3,868,272 | 2/1975 | Tardoskegyi | 134/26 |
| 4,025,363 | 5/1977 | DeSantis | 134/200 X |
| 4,299,425 | 11/1981 | Clapper | 134/200 X |
| 4,785,836 | 11/1988 | Yamamoto | 134/200 X |
| 5,030,293 | 7/1991 | Rich et al. | 134/32 |
| 5,048,549 | 9/1991 | Hethcoat | 134/122 R |
| 5,051,136 | 9/1991 | Touminen | 134/15 |
| 5,055,138 | 10/1991 | Slinn | 134/11 |
| 5,067,983 | 11/1991 | Uchino | 134/1 |
| 5,129,956 | 1/1992 | Pickering | 134/15 |

FOREIGN PATENT DOCUMENTS 529986 12/1940 United Kingdom ............ 134/56 R

Primary Examiner—Philip R. Coe
Attorney, Agent, or Firm—Geoffrey H. Krauss

[57] ABSTRACT

A controlled agitation cleaning system, for cleaning parts with a flammable cleaning liquid, has a container with an interior volume sufficient to accept a quantity of the cleaning liquid and an opening through which an item to be cleaned can be placed in the cleaning liquid. A lid closes the container opening. Several agitation nozzles extending in liquid-tight manner through a wall of the container, with each nozzle arranged to direct the volume of cleaning liquid flowing through that nozzle toward an associated container volume portion, when an air-operated pump moves the cleaning liquid through the nozzles. The pump is activated only when the lid has provided a positive closure of the container opening.

20 Claims, 2 Drawing Sheets

CONTROLLED AGITATION CLEANING SYSTEM

BACKGROUND OF THE INVENTION

The present invention relates to systems for cleaning electronic parts and, more particularly, to a novel system for electronic part cleaning utilizing controlled agitation of an alcohol-based cleaning solution.

Modern electronic technology requires that almost all electronic components be soldered to the wiring provided for component interconnection. The soldering processes actually utilized leave residue which must be removed from the electronic components, wiring, printed circuit boards, modules, and the like. Almost all of the present methods for cleaning electronic components and modules involve the use of various solvents which have generally been found to be harmful, in some degree, to the environment. It is therefore highly desirable to provide some method for cleaning such soldered electronic items with solvent materials that do not have a harmful atmospheric effect. One alternative cleaning solution which is known to provide the proper cleaning action, comprises alcoholic liquids, of either a single component or a blend of alcohol components; alcoholic cleaning components have a flammability risk due to the low flash point of the alcohols involved. Flammability risk rises if the alcoholic cleaning solutions are used in the conventional spray cleaning manner. While it is highly desirable to provide a single alcohol or alcohol-blend fluid in adequate volume to clean electronic components and modules, it is even more highly desirable to do so in such manner as to meet safety requirements which will eliminate the flammability hazard. Therefore, an alcohol-liquid-based cleaning system which is free of electrical power and electrical-driven parts, to totally eliminate spark/arc hazards (as well as electrical shock hazards to a user) is extremely desirable. Even more desirable is a cleaning system which can also be provided in such manner as to essentially eliminate the risk of electro-static discharge (ESD) damage to sensitive electronic components to be cleaned therein.

BRIEF SUMMARY OF THE INVENTION

In accordance with the invention, a controlled agitation cleaning system, for cleaning parts with a flammable cleaning liquid, has a container with an interior volume sufficient to accept a quantity of the cleaning liquid and an opening through which an item to be cleaned can be placed in the cleaning liquid. A lid closes the container opening. Several agitation nozzles extending in liquid-tight manner through a wall of the container, with each nozzle arranged to direct cleaning liquid flowing through that nozzle toward an associated container volume portion, when an air-operated pump moves the cleaning liquid through the nozzles. The amount of liquid agitation depends upon pump activity, which can be varied; the pump is activated only when the lid has provided a positive closure of the container opening.

A presently preferred embodiment of our novel controlled-agitation cleaning system includes a separate compartment having an air knife subsystem to dry the cleaned parts or modules, so as to reduce cycle time. Recovery of the cleaning solvent from the drying (air knife) volume is possible, thereby reducing solvent evaporative loss to the atmosphere outside the cleaning system.

Accordingly, it is an object of the present invention to provide a novel controlled-agitation cleaning system capable of operation utilizing alcohol-based cleaning fluids.

This and other objects of the present invention will become apparent to those skilled in the art upon reading the following detailed description of a presently preferred embodiment, when considered in conjunction with the associated drawings.

DETAILED DESCRIPTION OF THE INVENTION

Figure 1:
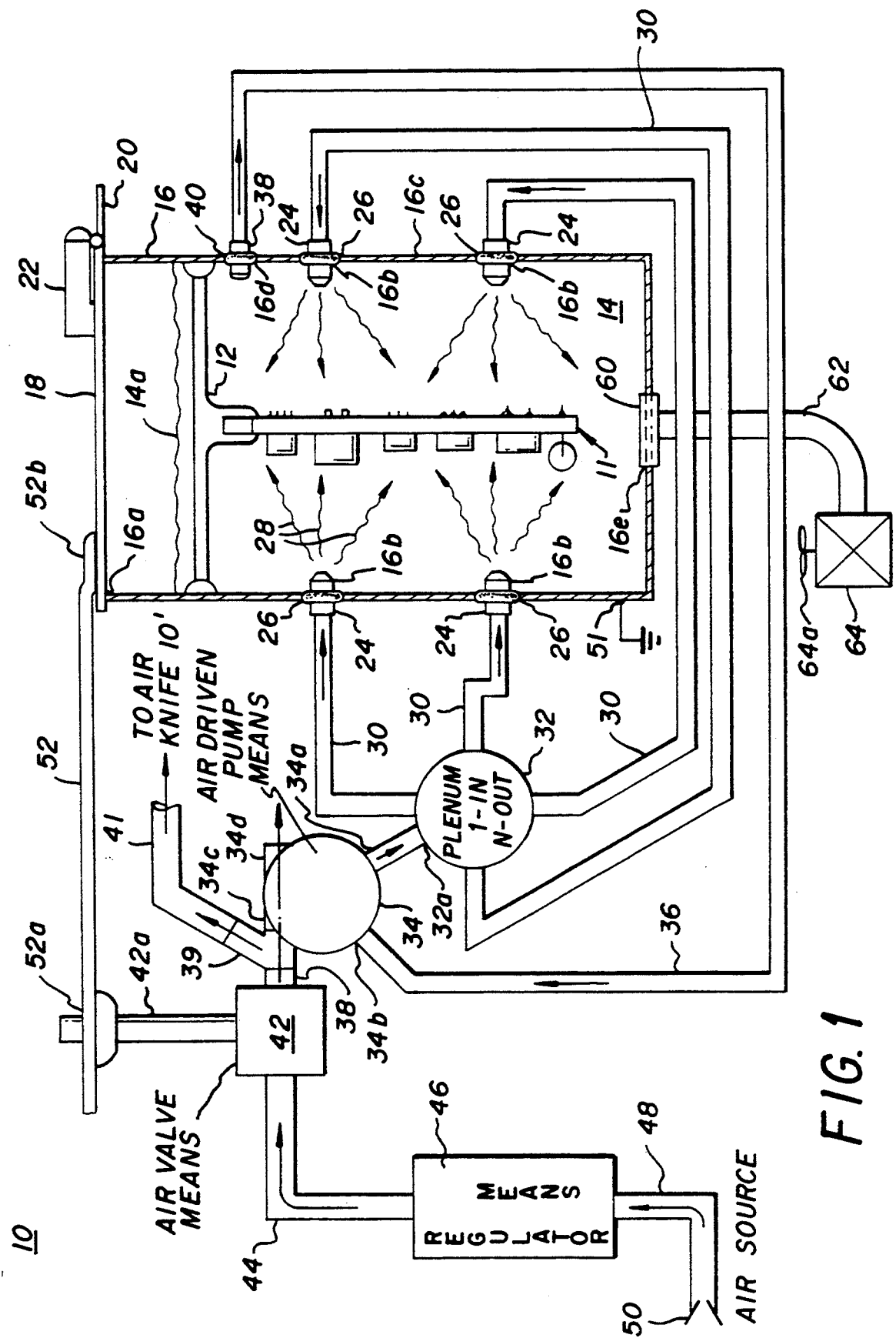
FIG. 1 is a schematic diagram of a presently preferred embodiment of our controlled-agitation cleaning system, in accordance with the principles of the present invention.
Figure 2:
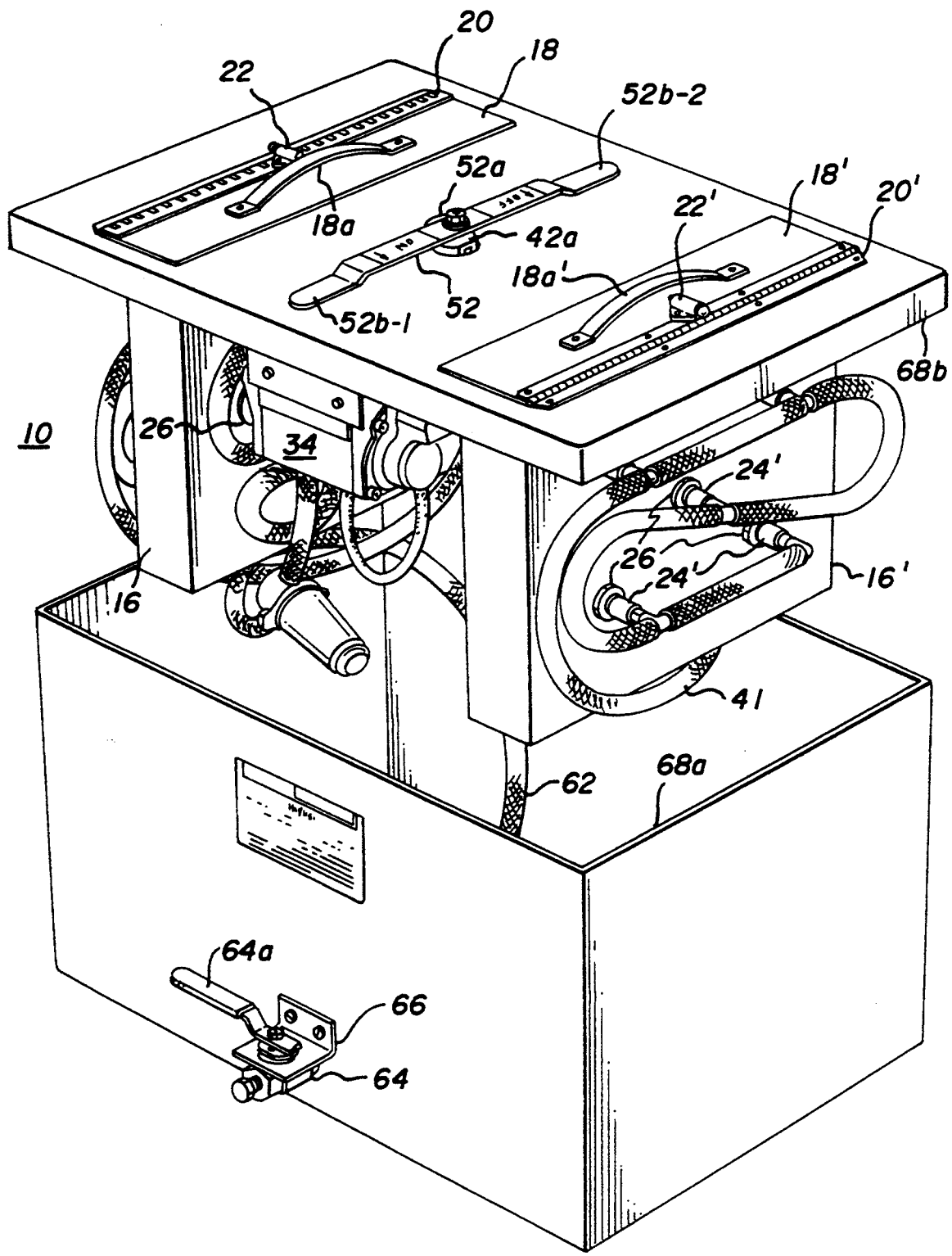
FIG. 2 is a prospective drawing of one system embodiment, and useful in appreciating several features of our invention.

Referring to both FIGS. 1 and 2, one embodiment of our novel controlled agitation cleaning apparatus 10 operates to remove soldering residues and the like undesired materials from an electronics item 11, which may be a printed circuit board, assembly or module, or even loose and separate parts, retained in some form of carrier means 12 selected to suspend the item 11 in a quantity of cleaning fluid 14 contained in an electrically conductive container 16. Means 12 may bear against the container interior walls, may hook over the upper lip 16a of the container or use like support to suspend the item(s) 11 to be cleaned. Container 16 may have a rectangular cross-section, as illustrated, or may have such other cross-sectional shape (circular, square, etc.) as desired for the particular end items to be cleaned; similarly, the depth of the container 16 and the quantity of cleaning fluid 14 may be varied over a wide range to facilitate cleansing of different items 11.

We use an alcoholic cleaning fluid 14, such as isopropyl alcohol, and presently prefer a multi-alcohol-blend cleanser marketed by Micro-Care Corp. (of Bristol, Conn. 06010) under the tradename PROCLEAN. All of these alcoholic cleaning fluids are flammable. Container 16 has an electrically-conductive lid means 18 installed on a hinge means 20, to bear against container lip 16a. A spring-loaded means 22 can be used to urge the lid normally closed against the container lip to provide a low-leakage enclosure for the cleaning liquid; force must be applied to a lid handle means 18a to cause the lid to rotate about the hinge means 20 and open the container for introduction of the item to be cleaned. Advantageously, at least lid 18 is formed of an electrically conductive (metal) material, so that the flammable fluid 14 is contained within a conductive vessel, as long as the lid is closed; the hinge means 20 is preferably conductive, to provide an alternate conductive path between an open lid and the container. In this manner, the flammable fluid 14 is contained and shielded from sparks, arcs and the like ignition phenomena, both in the statically-disposed condition, and when the fluid 14 is subjected to controlled agitation for dynamic cleaning operation. The container is electrically grounded to provide ESD protection for electronic parts, and for safety during fluid additions and removal.

The container has a plurality N of nozzles 24, each extending through an associated aperture 16b in the container wall 16c, and each retained by a liquid-tight gasket means 26 and the like. The nozzles are disposed in a predetermined pattern about the volume of fluid 14 in which item 11 will be placed, e.g. with substantially equal height and radial dispersion, so as to cause the fluid streams 28 expelled from each nozzle to move and agitate the cleaning fluid in an associated volume of the fluid, such that substantially all fluid 14 portions will be so agitated when the streams 28 from all nozzles 24 are active. It is important that the nozzles all be placed so that the agitation streams emitted therefrom are each immersed in the fluid and do not appreciably roil or otherwise disturb the fluid surface 14a, so as to minimize combustible vapor production.

A portion of each nozzle means 24 exterior to the container 16 is connected to an associated tubing means 30, which extends to a plenum chamber 32 having a single fluid input 32a and at least one fluid output from which hoses 30 connect to the various nozzles 24, in any desired series, parallel or mixed combination; the illustrated plenum 32 is a single-input, N-output chamber from which the like plurality N of tubes 30 extend in parallel, each to an associated nozzle. The liquid to input 32a is provided at an output 34a of a pump means 34, having a liquid input 34b connected by an in-flow hose line 36 to an exit nozzle 38 passing through another aperture 16d in the container wall 16c, and retained therein by a liquid-tight gasket means 40. Exit nozzle means 38 is typically positioned in the upper half of the cleaning fluid volume, and preferably is slightly above the top-most set of agitation nozzles 24; by so positioning the exit nozzle, any reduction in liquid 14 volume will reduce the return of fluid to the pump, reducing the flow through the nozzles and thus reducing the amount of agitation, before stopping agitation is the fluid level falls below the exit nozzle; it will also cause "sucking" noises to emanate from nozzle 38 and alert operating personnel with an audible increase in the pump sounds.

In accordance with one aspect of our invention, pump means 34 is driven by a stream of pressurized air introduced into an air input coupling 34c and exhausted from an air output coupling 34d; an insulative hose 38 can provide pressurized air to the pump, preferably via a T or Y connector 39 which also connects to additional hose 41, which conducts some of the supply air to an optional air knife portion 10' of the cleaner (discussed further hereinbelow). It should be understood that plenum means 32 may be part of the pump means 34, so that the liquid return line 36 enters the pump, which outputs the fluid under increased pressure, through one or more nozzle-connection lines 30, to the agitation nozzles 24; the amount of agitation is controlled by the fluid pressure, and therefore may be set by adjustment of pump characteristics. Use of a pump driven by compressed air avoids location of electrical pumps or any other electrical apparatus near the cleaner 10, and thus essentially eliminates this source of arcs, sparks or other flammable vapor-ignition risk in the apparatus. To further this safety purpose, the air source (typically remotely located outside the room in which the cleaning apparatus 10 is located) and the pump are connected via non-conductive air conduit 38 to an air valve means 42, which is itself connected via non-conductive air conduit 44 to such pressure regulating, filtering, lubricating and the like means 46 as may be necessary for proper operation of valve means 42 and/or pump means 34. Means 46 is itself connected via non-conductive air conduit means 48 to the remote air source connection 50. Thus, there exist multiple conduction breaks between an electrically-operated air pressure source and the apparatus, so that the possibility of ignition currents is essentially reduced; an electrical ground connection 51 is preferred at container 16.

To assure that the container is covered by lid 18, to minimize fire risk during agitation, the air valve means is selected for operation responsive to rotation of its control shaft 42a; the shaft is affixed to a central portion 52a of a control switch lever handle 52, which has at least one end portion 52b so shaped as to bear upon and press lid 18 against the container lip 16a when the lever handle is rotated sufficiently to operate the valve to the "on" condition. Thus, the handle controls the valve to the "off" condition and agitation is disabled when the handle end 52b is moved to allow lid 18 to open and expose the liquid 14, and the lid is secured, and a vapor-resistant and conductive barrier completed around the fluid volume, before the valve allows pressurized air to enter the pump and move liquid to the agitation nozzles.

A drain means 60 may be placed in liquid-tight fashion in another aperture 16e, preferable in the bottom of the container, and connected by hose means 62 to a drain valve 64. This valve is passed through a liquid-tight gasket 66 in an apparatus casement lower member 68a; the remainder of the apparatus 10 structure may be carried upon a casement upper member 68b. The members 68a/68b close in generally tight-fitting manner, so that any leaks of cleaning fluid from container 16, plenum/pump means 32/34 or any of the fluid-carrying hoses 30/36, will be caught and contained within the casement. It should again be noted that a leak will cause the level of fluid within the container 16 to fall and eventually expose part of exit nozzle 40, so that an abnormal aural sound will alert the user when the pump is turned on, even if the user has not properly visually checked the fluid level!

As shown in FIG. 2, the apparatus can contain an air knife portion 10', in which the split supply air is carried by hose 41 to air nozzles 24' extending into the interior volume of another container 16'. The cleaned item 11, after withdrawal from container 16, can be placed in container 16' and any cleaning fluid remaining on the item 11 removed therefrom by impinging air streams and gravity. The removed fluid may be drained from the bottom of the air knife container 16' and returned to the pump. A separate knife compartment cover means 18', with its own hinge means 20', urging means 22', handle 18'a, is provided in upper casement portion 68b, to contain the flammable vapors. Handle end 52a may be positioned to press lid 18' against container 16' before the pump is actuated.

While one presently preferred embodiment of our novel controlled agitation cleaning system is described in detail herein, many variations and modifications will now be apparent to those skilled in the art. It is our intent, therefore, to be limited only by the scope of the appending claims and not by way of details and instrumentalities set forth herein.

What we claim is:

1. A controlled agitation cleaning system, comprising:
   a quantity of a cleaning liquid;
   a container having an interior volume in which the cleaning liquid is contained, and an opening through which at least that portion of an item to be cleaned can be placed in the cleaning liquid and immersed below a surface thereof;
   lid means for closing the container opening;

a plurality of agitation nozzles extending in liquid-tight manner through a wall of said container and each immersed in the liquid, below the surface thereof, and arranged to direct any cleaning liquid flowing through that nozzle to enter and agitate an associated portion of said liquid below said surface; and pump means for moving said cleaning fluid through said nozzles only when said lid means has closed said container opening.

2. The cleaning system of claim 1, wherein said pump means is operated by pressurized air.

3. The cleaning system of claim 2, further comprising valve means for controllably connecting a remote source of pressurized air to said pump means.

4. The cleaning system of claim 3, further comprising means for controlling said valve means to cause the flow of pressurized air to said pump means only when said lid means has closed said container opening.

5. The cleaning system of claim 4, wherein said controlling means includes a member having a first portion attached to said valve means and a second portion located to force said lid to close said container opening before said first portion can open said valve means for flow of pressurized air to said pump means.

6. The cleaning system of claim 2, further comprising means utilizing pressurized air exhausted from said pump means for removing at least some of said cleaning fluid from the cleaned item.

7. The cleaning system of claim 1, further comprising exit nozzle means for facilitating withdrawal of cleaning fluid from said container to said pump means.

8. The cleaning system of claim 7, wherein said exit nozzle means includes at least one exit nozzle located at least as high in the container as an uppermost one of said agitation nozzles.

9. The cleaning system of claim 1, further comprising means for draining the cleaning liquid from said container.

10. The cleaning system of claim 1, further comprising a casement having a surface supporting said lid means and substantially enclosing said pump means, said container and said nozzles.

11. The cleaning system of claim 10, wherein said casement is a liquid-tight box having a wall completely enclosing said cleaning system and through which wall pass said lid means and hose means for providing externally-pressurized air to said pump means.

12. The cleaning system of claim 11, further comprising means for draining liquid from said container to beyond an exterior surface of said box wall.

13. The cleaning system of claim 1, wherein a separate plenum is provided to distribute the pressurized cleaning liquid from said pump means.

14. The cleaning system of claim 13, wherein each of said nozzles is separately connected to said plenum.

15. The cleaning system of claim 1, wherein the cleaning liquid is flammable, and further including mechanical means for urging at least a portion of said lid means to normally close off a liquid-containing volume of the container volume.

16. The cleaning system of claim 15, wherein the cleaning liquid comprises at least one alcohol.

17. The cleaning system of claim 15, wherein the container and the lid means portion are formed of an electrically conductive material.

18. The cleaning system of claim 17, further comprising electrically non-conductive hose means connected to said nozzles for facilitating cleaning liquid flow therethrough.

19. The cleaning system of claim 1, further comprising electrically non-conductive hose means connected to said pump means for facilitating pressurized air flow therethrough.

20. The cleaning system of claim 1, wherein said lid means includes means for urging said lid against said container opening in the absence of a lid-opening force.

* * * * *